United States Patent [19]

Franks

[11] 3,963,911
[45] June 15, 1976

[54] HYBRID SAMPLE DATA FILTER
[75] Inventor: Lewis E. Franks, Amherst, Mass.
[73] Assignee: The United States of America as represented by the Secretary of the Air Force, Washington, D.C.
[22] Filed: Apr. 22, 1975
[21] Appl. No.: 570,975

[52] U.S. Cl. .............................. 235/156; 325/38 B; 332/11 D; 333/18; 333/28 R; 333/70 T
[51] Int. Cl.² ................... H03H 7/10; H03K 13/22; G06F 7/38
[58] Field of Search ........... 235/152, 156; 325/38 B, 325/42; 328/162, 167; 332/11 D; 333/18, 28 R, 70 T

[56] References Cited
UNITED STATES PATENTS
| | | | |
|---|---|---|---|
| 3,633,170 | 1/1972 | Jones | 325/38 B X |
| 3,814,917 | 6/1974 | Nussbaumer | 235/152 |
| 3,906,400 | 9/1975 | Gooding et al. | 332/11 D |

OTHER PUBLICATIONS
Lockhart, G. B. Digital Encoding and Filtering Using Delta Modulation, In the Radio & Elect. Eng., 42(12): pp. 547–551, Dec., 1972.
Peled, A. et al., A New Approach to the Realization of Nonrecursive Digital Filters, In IEEE Trans. Aud. & Elect. AC., Au21(6): pp. 477–484, Dec., 1973.

*Primary Examiner*—R. Stephen Dildine, Jr.
*Attorney, Agent, or Firm*—Joseph E. Rusz; Julian L. Siegel

[57] ABSTRACT

A sample data filter using a delta modulator to feed a shift register of which selected outputs are pulsewidth weighted. Each of the coefficient multipliers include a flip-flop fed by one of the taps of the shift register and triggered by a clock. A synchronous counter, common to each of the multipliers, is fed to a NAND gate that clears the flip-flop. Interposed between the counter and the NAND gate are a series of switches, one for each stage of the counter. The flip-flop controls a switch to a source of reference voltage and the output of this switch controlled voltage from each of the multipliers is summed and fed to a demodulator.

2 Claims, 3 Drawing Figures

HYBRID SAMPLE DATA FILTER

STATEMENT OF GOVERNMENT INTEREST

The invention described herein may be manufactured and used by or for the Government for governmental purposes without the payment of any royalty thereon.

BACKGROUND OF THE INVENTION

This invention relates to encoding and filtering, and more particularly to a hybrid sample data filter.

In certain applications it is possible to use hybrid implementation techniques (involving a combination of analog and digital devices to perform arithmetic operations) in order to design filters without the high costs and complexity of an all-digital realization. It is desirable, however, to retain the response characteristics and design flexibility features associated with digital filters. Neglecting quantization, aliasing, and round-off effects, the digital filter is equivalent to a sampled-data filter whose analog input and output signals, $x(t)$ and $y(t)$ are related by $$\sum_{i=0}^{M} b_i y(t - iT) = \sum_{j=0}^{N-1} a_j x(t - jT) \qquad (1)$$

where $1/T$ is the sampling rate and it is normally assumed the $x(t)$ is band limited to the frequency interval, $f < 1/2T$. When $b_1 = b_2 = \ldots b_M = 0$, the input/output relation is nonrecursive and is equivalent to an analog transversal filter constructed from a tapped delay line. Digital filters normally use pulse code modulation (PCM) to represent sample values of the analog signals and the operations in Equation (1) are performed with binary logic elements. An alternative approach is to use delta modulation to encode the signal into binary form. Generally delta modulation in connection with digital filtering has been primarily limited to its use as an intermediate step in forming the PCM encoded signal. The delta encoded signal itself has unique properties which permit certain analog operations to be performed with conventional binary logic devices. Also, the implementation of encoders and decoders for delta modulation is more practical than the A/D and D/A converters for PCM.

In the past, systems were utilized for digital encoding and decoding and digital filtering, such as that described by Gordon B. Lockhart, in "Digital Encoding and Filtering Using Delta Modulation," in The Radio and Electronic Engineer, Vol. 42, No. 12, pp 547–551, Dec. 1972. However, the present invention is an improvement over these past systems in that it is only necessary to tap a shift register at every $k^{th}$ stage instead of every stage, and the scaling of the signals is accomplished by pulsewidth modulation (which can be easily implemented in either an analog or digital fashion) rather than by the analog scheme involving a precision resistance weighting network. The pulse-width modulation technique of the present invention is more economical and practical to implement in integrated circuit form.

SUMMARY OF THE INVENTION

This invention uses delta modulation to create a digital (binary) version of the input signal, a shift register to provide time delayed versions of this signal, digitally controlled pulsewidth modulators to effect scaling of the signals, and analog summers to provide the signal which, when passed through a delta demodulator, is a close approximation to the desired output signal for the filter.

It is therefore an object of this invention to provide a novel and improved sample data filter over those used in the past which is more economical and practical to implement.

It is another object to provide a sample data filter in which scaling is performed by the adjustment of width rather than by height.

It is still another object to provide a sample data filter using a shift register that is tapped only at selective stages instead of at every stage.

These and other objects, features and advantages of the invention will become more apparent from the following description taken in conjunction with the illustrative embodiments in the accompanying drawings, wherein:

DESCRIPTION OF THE DRAWINGS

FIG. 3 is a block diagram of the hybrid recursive sample data filter which also uses the coefficient multiplier circuitry shown in FIG. 2.

DETAILED DESCRIPTION OF THE PREFERRED EMBODIMENTS

Figure 1:
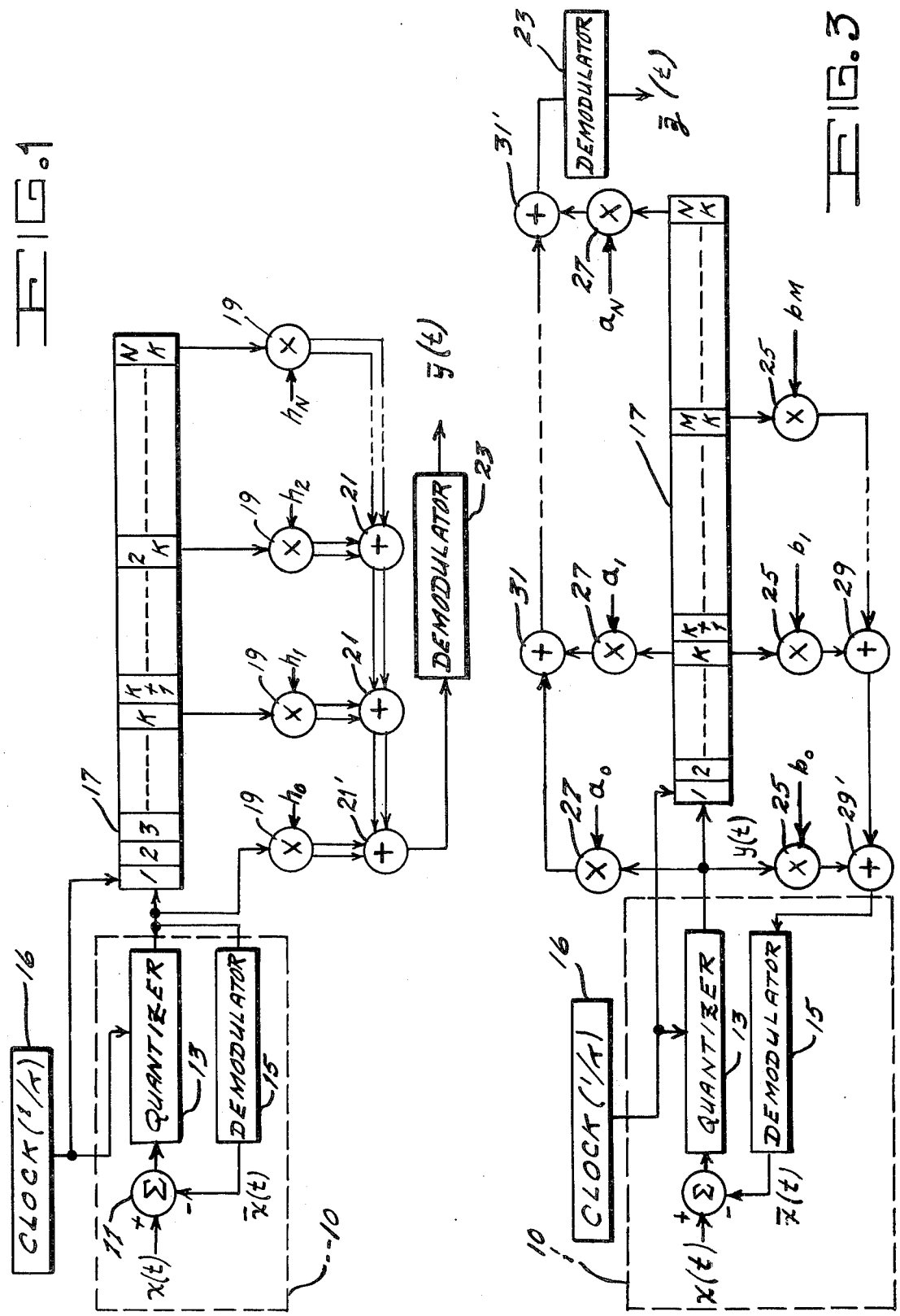
FIG. 1 is a block diagram of the hybrid nonrecursive sample data filter.

The schematic diagram shown in FIG. 1 has a transfer function of the same form as an $N^{th}$ order nonrecursive digital filter. Delta modulator 10 includes summing circuit 11, 1-bit quantizer or comparator 13, and delta demodulator 15 in the feedback path. Delta demodulator 15 can be an analog integrator. The output of quantizer 13 is fed to shift register 17 which has N taps and K stages per tap. Both shift register 17 and quantizer 13 are pulsed by clock 16 which has a pulse rate of $(1/\tau)$ where $\tau$ is the sample interval $$\bar{y}(t) = \sum_{j=0}^{N} h_j \bar{x}(t - jT) \qquad (2)$$

where is is assumed prescaling is done so that $h_j$ 1 for $j = 0, 1, \ldots N$, and where $T = K\tau$. If the delta modulation sampling interval $\tau$ is small enough, compared to the reciprocal of the bandwidth of the $x(t)$ signal, then $\bar{x}(t)$ is a close approximation to $x(t)$ according to well-known delta modulation practice. The operating bandwidth of a digital filter is normally taken to be ½ T. Thus the parameter K, the number of shift register stages per tap, essentially characterized the precision of the delta modulation operation. Values of K ranging from 5 to 15 will offer adequate accuracy in most applications.

At the $K_j$ tap there is a connection to a series of coefficient multipliers 19 for scaling the delayed outputs which are multiplied by $h_0, h_2, \ldots h_n$. The outputs of each of the coefficient multipliers 19 are fed to summers 21 together with an output of an adjacent summer forming a series of sums. The final sum is taken from summer 21'. Summers 21 can be individual summing circuits or there can be a single summing circuit 21' such as a summing amplifier and summers 21 would then represent connecting points on a bus bar entering summing circuit 21'. The output of summing circuit 21' is fed to demodulator or integrator 23 which produces the analog output signal $y(t)$.

Figure 2:
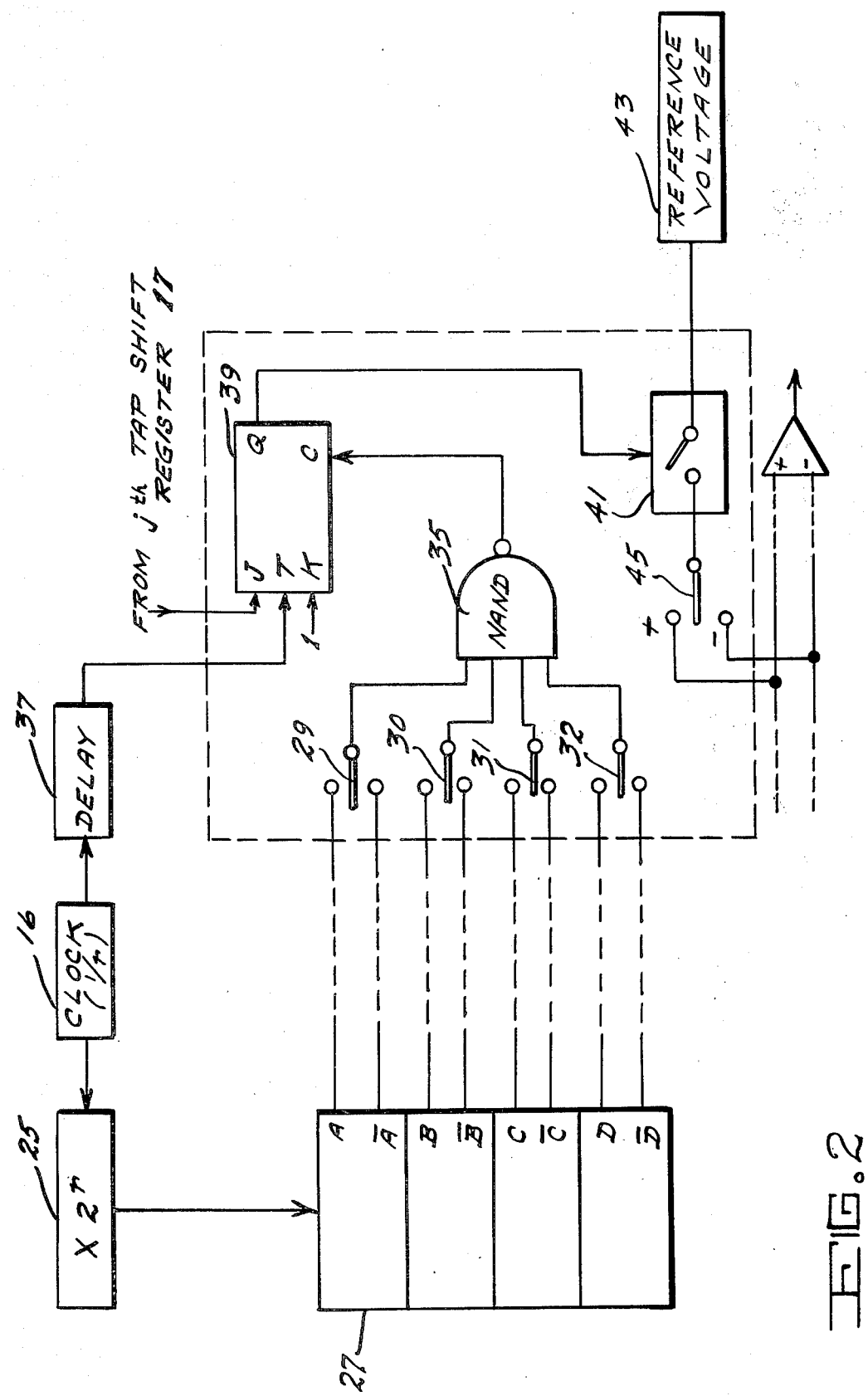
FIG. 2 is a block diagram of the coefficient multiplier circuity used in the embodiment of FIG. 1.

With delta modulation, the multiplication of the signal by the scalar value, $h_j$, can be accomplished in a novel way. The delta demodulated signal is proportional to the area of its constituent binary pulses, therefore scaling can be accomplished by appropriate adjustment of the width, rather than the height, of each pulse. This width modulation can be digitally controlled and an implementation of one of the pulsewidth modulators is shown in FIG. 2.

Clock 16 with a frequency of $(1/\tau)$ is fed to multiplier 25 which multiplies the clock pulses by a factor of $2^r$ where $r$ is the number of flip-flop stages in synchronous binary counter 27 which is pulsed by the frequency output of multiplier 25. In the example shown, $r = 4$, and the complementary outputs of each of the $r$ stages of counter 27 is connected to switches 29 to 32. These switches are the coefficient settings where "1" is represented by a switch in the up position. Each of the switches 29 to 32 then is connected to NAND gate 35.

The pulses from clock 16 are also fed through delay 37 to the trigger terminal of flip-flop 39. At the beginning of each $\tau$-second interval, J-K flip-flop 35 takes on the state (1 or O) stored in the corresponding stage of the shift register at that time. If there is a 1 at the shift register tap, then flip-flop 37 will generate a pulse whose width is determined by the time that the clear pulse arrives from NAND gate 35. This pulse at the output of the r-input NAND gate can occur at any one of $2^r$, equally spaced instants across the $\tau$-second interval, depending on the positions of coefficient setting switches 29–32. The binary representation for the switch settings is identical to the binary representation for $h_j$, the ratio of pulsewidth to $\tau$. Hence, the coefficient multipliers on this hybrid filter are set up in the same manner as on a digital filter using r-bit coefficient accuracy. The resulting pulse from flip-flop 39 is used to activate programmable switch 41 producing a pulse with accurately controlled height of $V_{ref}$ from voltage source 43 and having a width of $h_j \tau$.

A "one" output from flip-flop 39 will turn switch 41 on for $h_j < 0$. This pulse will be routed to the negative summing bus by coefficient sign switch 45. For $h_j$ 0, the pulse will be routed to the positive summing bus. With a slightly more complex solid state switch, it can be arranged to provide for a bipolar delta modulation to go to the summing bus.

Another embodiment of the invention is a recursive version of the hybrid sample data filter as shown in FIG. 3. Here summing circuit 11, quantizer 13, demodulators 15 and 23, clock 16 and shift register 17 are the same as that shown in FIG. 2. In this embodiment the feedback signal for delta modulator 11 is a linear combination of signals from the taps of shift register 17. Each of the coefficient multipliers 25 that multiply the outputs of the shift register taps with $b_i$ ($i = 0, 1, \ldots M$) and the coefficient multipliers 27 that multiply corresponding outputs of the shift register taps with $a_j$ ($j = 0, 1 \ldots N$) are the same that are described in detail in FIG. 2.

For this recursive embodiment $$b_o \bar{z}(t) = \sum_{j=0}^{N} a_j \bar{x}(t - jT) - \sum_{i=1}^{M} b_i z(t = iT) \quad (3)$$

which corresponds to a recursive digital filter whose transfer function is $$H(D) = \frac{P(D)}{Q(D)} \quad (4)$$

where $$P(D) = \sum_{j=0}^{N} a_j D^j$$

$$Q(D) = \sum_{i=0}^{M} b_i D^i$$

and $$D = e^{ij2\pi fT}$$

Summation of the outputs of multipliers 25 takes place in adders 29, each adding the output of one of the multipliers 25 with the contents of an adjacent adder. The last adder in this sequence 29' is fed to demodulator 15 of delta modulator 10 to complete the recursive loop. Similarly adders 31 sum the contents of coefficient multipliers 27 with the contents of an adjacent adder. The last adder 31' in the sequence is fed to final demodulator 23 to produce the analog output signal $z(t)$.

What is claimed is:
1. A nonrecursive sample data filter comprising:
   a. a delta modulator;
   b. a shift register fed by the delta modulator having a series of selected output taps;
   c. a clock pulsing the delta modulator and the shift register;
   d. means for scaling the series of outputs of the shift register, the scaling means including
      1. a reference voltage source,
      2. a counter pulsed by the clock and having a series of complementary pairs of outputs,
      3. a plurality of coefficient multipliers each fed by the plurality of complementary pairs of outputs of the counter and each including
         a. a plurality of coefficient setting switches each having an output terminal and a pair of selected input terminals, each of the pairs of input terminals connecting one of the complementary output pairs of the counter,
         b. a NAND gate fed by the output terminals of the plurality of coefficient setting switches,
         c. a flip-flop fed by one of the selected output taps of the shift register, triggered by the clock, and having a clearing terminal connected to the output of the NAND gate,
         d. a programmable switch having an input terminal connected to the reference voltage source and an output terminal, the programmable switch being activated by the output of the flip-flop; and
         e. a coefficient sign switch having an input terminal and a pair of selectable output terminals with the input terminal connected to the output terminal of the progammable switch,

4. means for summing the outputs of the coefficient multipliers, the summing means being connected to the coefficient sign switches; and
e. a demodulator connector to the output of the summing means.

2. A recursive sample data filter comprising:
a. a delta modulator;
b. a shift register fed by the delta modulator having a series of selected output taps;
c. a clock pulsing the delta modulator and the shift register;
d. means for scaling the series of outputs of the shift register, the scaling means including
  1. a reference voltage source,
  2. a counter pulsed by the clock and having a series of complementary pairs of outputs,
  3. first and second pluralities of coefficient multipliers each fed by the plurality of complementary pairs of outputs of the counter, and each including
    a. a plurality of coefficient setting switches each having an output terminal and a pair of selected input terminals and each of the pairs of input terminals connecting one of the complementary output pairs of the counter,
    b. a NAND gate fed by the output terminals of the plurality of coefficient setting switches,
    c. a flip-flop fed by one of the selected taps of the shift register, triggered by the clock, and having a clearing terminal connected to the output of the NAND gate,
    d. a programmable switch having an input terminal connected to the reference voltage source and an output terminal, the programmable switch being activated by the output of the flip-flop;
    e. a coefficient sign switch having an input terminal and a pair of selectable output terminals with the input terminal connected to the output terminal of the programmable switch,
  4. first and second means for summing respectively the outputs of the first and second plurality of coefficient multipliers with the first summing means being fed back to the delta modulator; and
e. a demodulator connected to the output of the second summing means.

* * * * *